United States Patent [19]
Thompson et al.

[11] Patent Number: 5,874,344
[45] Date of Patent: Feb. 23, 1999

[54] TWO STEP SOURCE/DRAIN ANNEAL TO PREVENT DOPANT EVAPORATION

[75] Inventors: Scott E. Thompson; Chai-Hong Jan, both of Portland, Oreg.

[73] Assignee: Intel Corporation, Santa Clara, Calif.

[21] Appl. No.: 777,544

[22] Filed: Dec. 30, 1996

[51] Int. Cl.[6] .................................................. H01L 21/336
[52] U.S. Cl. ............................................ 438/308; 438/765
[58] Field of Search ......................... 112/DIG. 7; 438/58, 438/96, 916, 308, 255, 142, 542

[56] References Cited

U.S. PATENT DOCUMENTS 5,525,529  6/1996  Guldi ................................ 148/DIG. 7

OTHER PUBLICATIONS

Goodman, A.M. et al. "Thin Tunnelable Layers of Silicon Dioxide Formed by Oxidation of Silicon" J. Electrochem. Soc.: Electrochemical Technology vol. 117, No. 7 (1970) pp. 982–984.

*Primary Examiner*—Charles Bowers
*Assistant Examiner*—Craig Thompson
*Attorney, Agent, or Firm*—Blakely, Sokoloff, Taylor & Zafman LLP

[57] ABSTRACT

A two step source/drain annealing process which permits a dopant to be ion implanted directly into the silicon without a protective oxide. The gate oxide is removed before the ion implantation of the dopant occurs, thus the dopant is implanted directly into bare silicon. In a first step of the annealing process, a thin oxide is grown over the source and drain regions at a relatively low temperature (e.g., 600° C.) this temperature to prevent the evaporation of the dopant from the silicon substrate and polysilicon gate. The second step of the annealing process occurs at a higher temperature allowing the dopant to be driven into the substrate forming the source and drain regions.

7 Claims, 2 Drawing Sheets

TWO STEP SOURCE/DRAIN ANNEAL TO PREVENT DOPANT EVAPORATION

BACKGROUND OF THE INVENTION

1. Field of the Invention

The invention relates to the field of forming doped regions in a semiconductor material such as in the formation of source and drain regions for field-effect transistors.

2. Prior Art

Often in the formation of source and drain regions for field-effect transistors, a dopant is implanted into the substrate in alignment with a gate such as a polycrystalline silicon (polysilicon) gate with or without spacers. The dopant is then driven into the substrate in an annealing step. Most often the ion implantation occurs through an oxide layer although in some cases the dopant is implanted directly into a silicon substrate.

There are advantages to implanting the dopant through an oxide layer. First, if the dopant is covered by the oxide layer in the drive step it is less likely to evaporate during the drive step. Secondly, the oxide layer provides protection from impurities that might otherwise collect on the substrate both during pre and post implant steps. There are, however, disadvantages to implanting dopant through the oxide. First, oxygen from the oxide layer is driven into the substrate during the implantation. This can cause leaky junctions to occur. Additionally, the oxygen once in the substrate, makes it more difficult to form a salicide once the oxide has been removed and a metal layer is formed over the source and drain regions.

As will be seen the present invention provides at least some of the advantages obtained from ion implanting through an oxide without the disadvantages which occur when the implantation occurs through the oxide layer.

SUMMARY OF THE INVENTION

An improved process for forming a MOS transistor on a substrate is described. First, a gate oxide layer is formed on the substrate followed by the forming of a gate on the insulative layer, most typically a polysilicon layer. The insulative layer is removed from the substrate on opposite sides of the gate, generally where the source and drain regions are to be formed thereby exposing the substrate. Ion implantation is used to dope the source and drain regions then occurs. Next an oxide is grown on the exposed substrate at a low temperature such that evaporation of the dopant does not occur. Then a higher temperature driving/annealing step is used to drive the dopant into the substrate.

DETAILED DESCRIPTION OF THE PRESENT INVENTION

A process for forming source and drain regions for a field-effect MOS transistor is described. In the following description specific times, temperatures, etc., are set forth in order to provide a thorough understanding of the present invention. It will be apparent to one skilled in the art that the present invention may be practiced without these specific details. In other instance, well-known processing steps such as masking, deposition, etching, etc., steps are not discussed in detail in order not to obscure the present invention.

Figure 1:
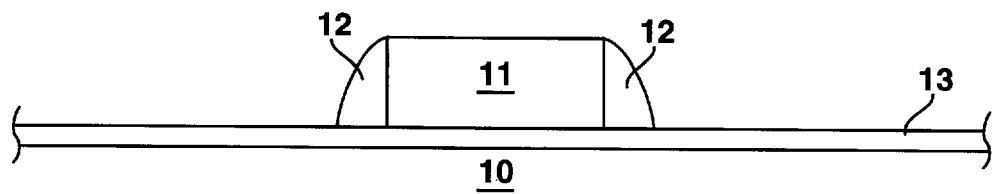
FIG. 1 is a cross sectional elevation view of a portion of a substrate showing a gate oxide layer, a polysilicon gate and spacers formed on opposite sides of the gate.

Referring first to FIG. 1 a portion of a monocrystalline silicon substrate 10 includes a grown gate oxide layer 13, a polysilicon gate 11 and spacers 12. The structure shown in FIG. 1 may be formed using any one of a plurality of well-known processes including processes where doped glass layers are formed under the spacers 12 to provide a source of dopant for the extensions (tips) of source and drain regions.

Figure 2:
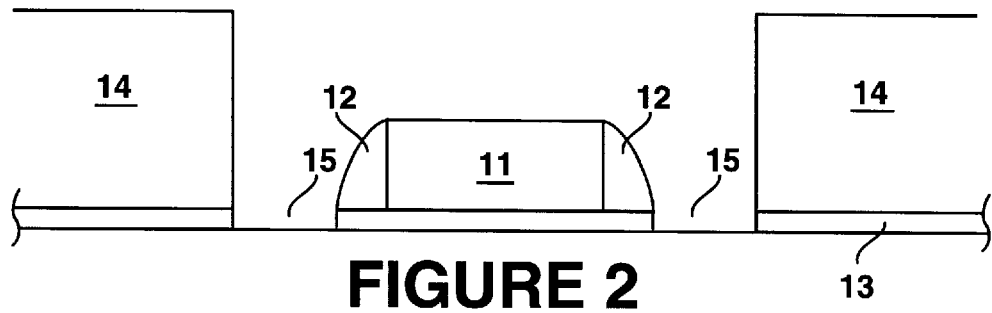
FIG. 2 illustrates the substrate of FIG. 1 after a masking step and an etching step are used to remove the oxide at the sites of subsequently formed source and drain regions.

Next as shown in FIG. 2, photoresist layer 14 is masked and developed to expose the gate 11 (including the spacers 12) and the future sites of the source and drain regions on opposite sides of the spacers 12. After this masking step, an etching step such as a hydrofluoric acid dip is used to remove the gate oxide layer 13 of FIG. 1 exposing the substrate at the subsequent sites 15 of the source and drain region. Thus the silicon is exposed at the future sites of the source and drain regions.

Now the substrate is subjected to an ion implantation step to implant a dopant into the silicon at the sites 15 and also into the gate 11. This is shown by the line 16 of FIG. 3. A dopant such as arsenic is implanted in a well-known manner to a concentration level determined in part by the desired characteristics and geometry of the field-effect transistor being formed.

Figure 3:
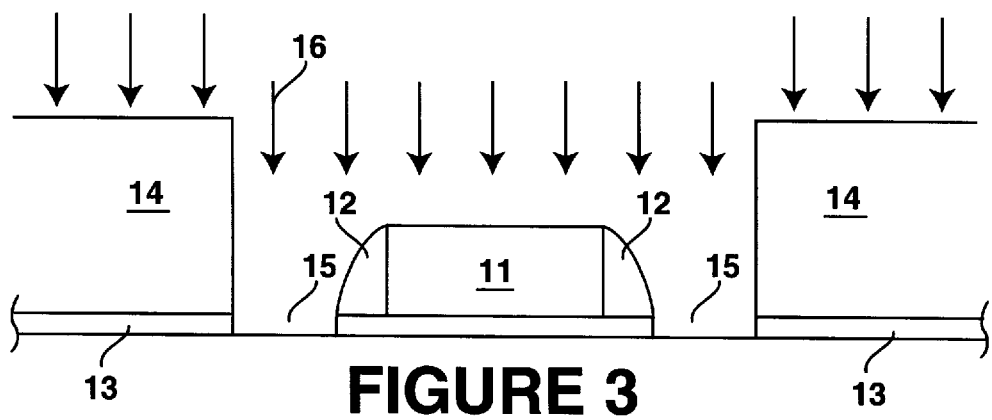
FIG. 3 illustrates the substrate of FIG. 2 after an ion implantation step.
Figure 4:
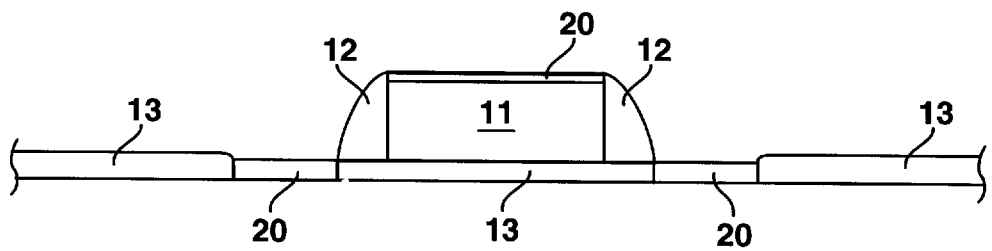
FIG. 4 illustrates the substrate of FIG. 3 after a thin oxide layer has been formed over the sites of the source and drain regions.
Figure 6:
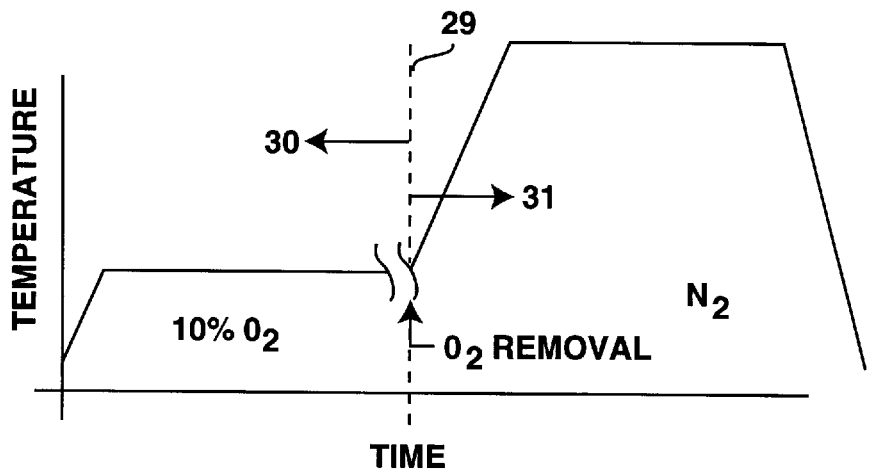
FIG. 6 is a graph showing the two step source/drain annealing used in the present invention.

Following the ion implantation, the photoresist 14 of FIG. 3 is removed and the substrate is subjected to an annealing step. This is shown in the graph of FIG. 6 by the arrow 30, that is, to the left of the dotted line 29. This first step of a two part annealing process is done at a relatively low temperature such as 600° C. in an ambient which includes oxygen such as 10% $O_2$. For instance, the substrate is ramped up to 600° C. at 75° per second and remains at 600° C. for 10–30 seconds at which time the oxygen is removed from the furnace. This first step of the two step annealing process causes a thin oxide 20 of approximately 10–20 Å to be grown at the sites 15 and on the polysilicon gate 20. This first step is at a low temperature to prevent evaporation of the implanted dopant such as arsenic from the sites 15 or from the polysilicon gate 11. Thus, the thin oxide 20 is formed without the loss of dopant.

Figure 5:
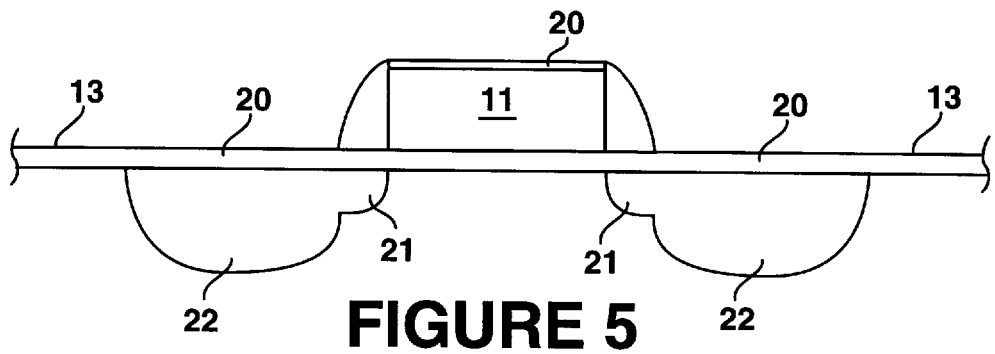
FIG. 5 illustrates the substrate of FIG. 4 after a driving step used to form the source and drain regions.

Now the oxygen is removed from the furnace as shown in FIG. 6 and the substrate is ramped at for instance 75° C. per second to a higher temperature such as 900°–1100° C. at which temperature it remains for 10–30 seconds. This second step in the annealing process is at a sufficiently high temperature so as to drive the dopant into the substrate forming the source and drain regions. Thus as shown in FIG. 5, the source and drain regions 22 with their shallower doped tip regions 21 are formed and additionally, the dopant is driven into the gate 11.

The source of dopant for the tip regions 21 is not discussed above since it may be provided by prior art steps such as from glass included as part of the spacers or from an ion implantation step done prior to the formation of the spacers.

By using the above two step annealing process described above, lower junction capacitance and improved junction leakage due to enhanced channeling of source/drain dopant which grade the source/drain junctions are obtained. Additionally, lower source/drain resistance and improved polysilicon gate doping occurs when compared to prior art processes where the oxide is implanted directly into the silicon since the thin oxide prevents dopant evaporation.

Figure 7:
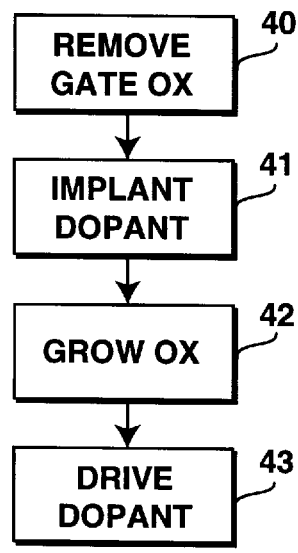
FIG. 7 illustrates the steps which are implemented in the present invention.

The steps of the present invention are shown in FIG. 7. First, the gate oxide is removed as shown by step 40 at the proposed sites of the source and drain regions. Next as shown by step 41, a dopant is implanted into the bare silicon at the proposed sites of the source and the drain regions. Following this as shown by step 42, a thin oxide is grown at a relatively low temperature so that an oxide is formed without the evaporation of the dopant from the silicon. Finally as shown by step 43, the second annealing step drives the dopant into the substrate forming the source and drain regions.

We claim:

1. An improved process for forming an MOS transistor on a substrate:

forming an insulative layer on the substrate;

forming a gate structure on the insulative layer;

removing the insulative layer on opposite sides of the gate structure so as to expose the underlying substrate;

ion implanting a dopant into the exposed substrate; and annealing the substrate initially at a first temperature in an ambient which includes oxygen, causing a protective oxide layer to form on the substrate to a thickness sufficient to prevent evaporation of the dopant at a second higher temperature, the first temperature being low enough to prevent substantial evaporation of the dopant and then raising the temperature to the second higher temperature in an ambient which does not include oxygen causing diffusion of the dopant into the substrate without substantial additional oxide growth.

2. The process, defined by claim 1 wherein the second temperature is between approximately 900° C. and 1100° C.

3. In the formation of an MOS transistor where dopant for source and drain regions is ion implanted into the substrate, improved processing comprising:

ion implanting the dopant directly into the substrate without a protective layer on the substrate where the dopant is being implanted; and annealing the substrate initially at a first temperature in an ambient which includes oxygen, causing a protective oxide layer to form on the substrate to a thickness sufficient to prevent evaporation of the dopant at a second higher temperature, the first temperature being low enough to prevent substantial evaporation of the dopant and then raising the temperature to the second higher temperature in an ambient which does not include oxygen causing diffusion of the dopant into the substrate without substantial additional oxide growth.

4. Forming the source and drain regions for an MOS transistor by:

ion implanting a dopant directly into the substrate;

annealing the substrate initially at a first temperature in an ambient which includes oxygen, causing a protective oxide layer to form on the substrate to a thickness sufficient to prevent evaporation of the dopant at a second higher temperature, the first temperature being low enough to prevent substantial evaporation of the dopant; and raising the temperature to the second higher temperature in an ambient which does not include oxygen causing diffusion of the dopant into the substrate without substantial additional oxide growth.

5. The process defined by claim 1 wherein the first temperature is approximately 600° C.

6. The process defined by claim 1 wherein the ambient at the first temperature contains approximately 10% oxygen.

7. The process defined by claim 1 wherein the first temperature is approximately 600° C. and the ambient contains approximately 10% oxygen.

\* \* \* \* \*

UNITED STATES PATENT AND TRADEMARK OFFICE
CERTIFICATE OF CORRECTION

PATENT NO. : 5,874,344
DATED : February 23, 1999
INVENTOR(S) : Thompson, et al.

It is certified that error appears in the above-identified patent and that said Letters Patent is hereby corrected as shown below:

In the title page at [75] please delete "Chai-Hong Jan" and insert --Chia-Hong Jan--

Signed and Sealed this

Seventeenth Day of August, 1999

Attest:

Attesting Officer

Q. TODD DICKINSON

Acting Commissioner of Patents and Trademarks